United States Patent [19]

Boichot-Castagne

[11] Patent Number: 4,675,598
[45] Date of Patent: Jun. 23, 1987

[54] CURRENT MEASURING DEVICE IN AN ELECTRICAL DISTRIBUTION SWITCHBOARD OR ENCLOSURE

[75] Inventor: Bernard Boichot-Castagne, Sassenage, France

[73] Assignee: Merlin Gerin, France

[21] Appl. No.: 720,804

[22] Filed: Apr. 8, 1985

[30] Foreign Application Priority Data

Apr. 9, 1984 [FR] France ................................ 84 05702

[51] Int. Cl.$^4$ ...................... G01R 1/20; G01R 19/22; H02H 3/093
[52] U.S. Cl. .................................... 324/126; 324/119; 324/127; 361/95
[58] Field of Search ............... 324/119, 126, 127, 110, 324/157; 361/95, 97, 96

[56] References Cited

U.S. PATENT DOCUMENTS 2,341,706  2/1944  Fields ................................ 324/119

FOREIGN PATENT DOCUMENTS 598543  6/1934  Fed. Rep. of Germany .
2441790  3/1976  Fed. Rep. of Germany .
3230047  2/1984  Fed. Rep. of Germany .
1397421  3/1964  France .

OTHER PUBLICATIONS

Elektrotechnik, vol. 61, No. 3, Feb. 1979, pp. 14–16, 18, 27.

Primary Examiner—Ernest F. Karlsen
Attorney, Agent, or Firm—Parkhurst & Oliff

[57] ABSTRACT

The invention consists in using current transformers incorporated in the electronic relays of a switchboard protective device and in connecting thereto current measurement indicators located on the front face of the switchboard.

3 Claims, 4 Drawing Figures

CURRENT MEASURING DEVICE IN AN ELECTRICAL DISTRIBUTION SWITCHBOARD OR ENCLOSURE

BACKGROUND OF THE INVENTION

The invention relates to an electrical distribution switchboard or enclosure comprising at least one indicator of the current flowing in a circuit of the switchboard, said indicator being located on the front face of the switchboard.

Traditionally, current measurement is performed by placing current transformers on the switchboard cables or busbars, to which ammeters are connected, themselves fixed to the front face of the switchboard or enclosure. These current transformers are costly, as is fitting them on the power conductors.

SUMMARY OF THE INVENTION

The object of the invention is to produce a simplified current measuring device using the current transformers incorporated in the switchboard protective switchgear, notably in the molded case circuit breakers or contactors.

By using the current transformers of the protective devices, it is no longer necessary to install special current transformers on the switchboard or enclosure busbars or cables. The switchboard indicators merely have to be connected to the system portective switchgear, notably to a circuit breaker or contactor, in order to provide an indication on the front of the switchboard of the current intensity flowing through the switchboard power conductor. The protective device is advantageously of the electronic release type in which the current transformer is associated with a processing unit which emits a tripping signal applied to a tripping relay of the device when the current in the power conductors exceeds a set overload or short-circuit threshold.

The indicator is connected in series with the processing unit in the circuit fed by the current transformer, and in the event of the protective circuit being accidentally broken, protection is no longer provided by the device disconnected from the cuirrent transformer. According to the invention, an adaptor, such as an electrical resistor, is connected to said terminals in parallel with said indicator to shunt the latter. The adaptor is incorporated in the protective device housing, and breaking of the external indictor connecting circuit no longer interrupts the connection between the current transormer and the processing unit. The shunt resistor should be in preference selected with a very high rating in relation to the internal indicator resistor so as not to disturb measurement. In the event of the indicator being disconnected, the current flows through the resistor.

In the case of a multipole switchboard, a current indicator can be associated with the current transormer of one of the phases or a measurement device comprised of the protective device current transformer in conjunction with the indicator can be associated with each of the phases. The alternating current output from the current transformer is the image of the current flowing in the associated circuit and the rating and graduation of the indicator are chosen to take the transformation ratio of the current transformer into account and to give a direct indication of the current intensity.

The indicator can be of the ferromagnetic type well suited to measuring alternating currents or voltages, but this type of indicator consumes a great deal of current. When the power of the current transformers incorporated in the protective device is insufficient to provide power both to the processing unit and to the indicator, it is preferable to use indicators of the elechromagnetic type which have a lower burden. The current which reaches the indicator should then be rectified, either by using an indicator with a built-in rectifier, or by fitting a rectifying device in the indicator power supply circuit. The rectifier may be a diode bridge inserted in the circuit connecting the current transformer to the processing unit, the indicator being connected to the two ends of the bridge.

According to another embodiment of the invention, the shunt resistor is interchangeable to constitute a rating adaptor. In the case set out above of a high rating resistor, the possibilities of adapting the rating are limited and a compromise consists of using a lower rating resistor to cover a wide range of current to be measured with a single indicator by varying this resistor. The resistor may be made up of a combination of several resistors electrically connected in series or parallel, at least one of these resistors being incorporated in the molded case to provide a connection between the current transformer and the processing unit when the indicator is disconnected.

The switchboard indicator or ammeter can be of the needle or any other type and it is of course possible to send information to other indicators or equipment external to the switchboard.

The invention also relates to a molded case electronic circuit breaker release supplied by current transformers. A current outlet is located on the moulded case to connect a current indicator, this outlet being located on the circuit connecting the current transformer to the electronic release processing unit. The outlet enables an external indicator to be connected to the molded case in particular fitted on the front of the switchboard incorporating the circuit breaker.

BRIEF DESCRIPTION OF THE DRAWINGS

Other advantages and characteristics will become more clearly apparent from the description which follows of various embodiments of the invention, given as examples only and represented in the accompanying drawings, in which.

DESCRIPTION OF THE PREFERRED EMBODIMENTS

Figure 1:
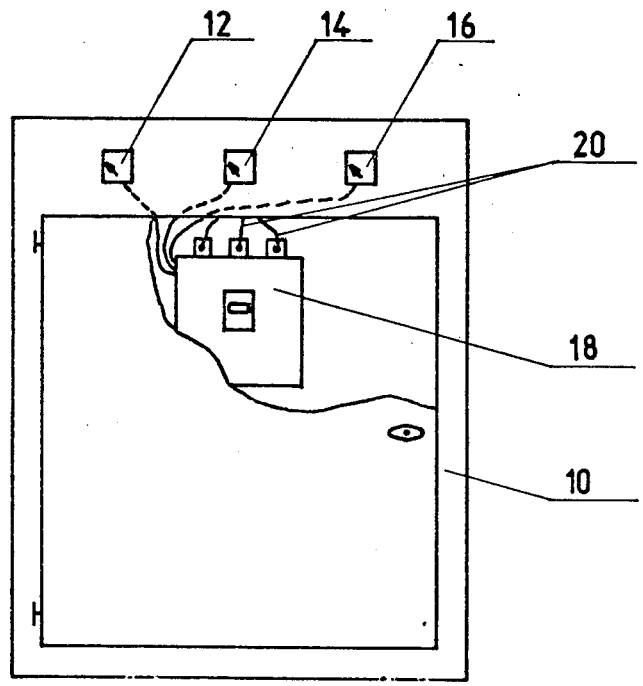
FIG. 1 is a schematic view of the front face of a switchboard fitted with a current measuring device according to the invention, with the door partially cut away.

In the figures, a switchboard or enclosure 10, notably a low voltage switchboard has indicators 12, 14, 16, notably ammeters, fitted on its front face. A molded case circuit breaker 18 is fitted on the switchboard incoming line with conductors or cables 20 supplying power to the switchboard 10 connected thereto. Switchboard 10 has other protective or control devices hidden by the door in FIG. 1, the circuit breaker 18 providing the overall switchboard protection. Switchboards or enclosures of this kind are well known to specialists and it is pointless describing them in greater detail.

Figure 2:
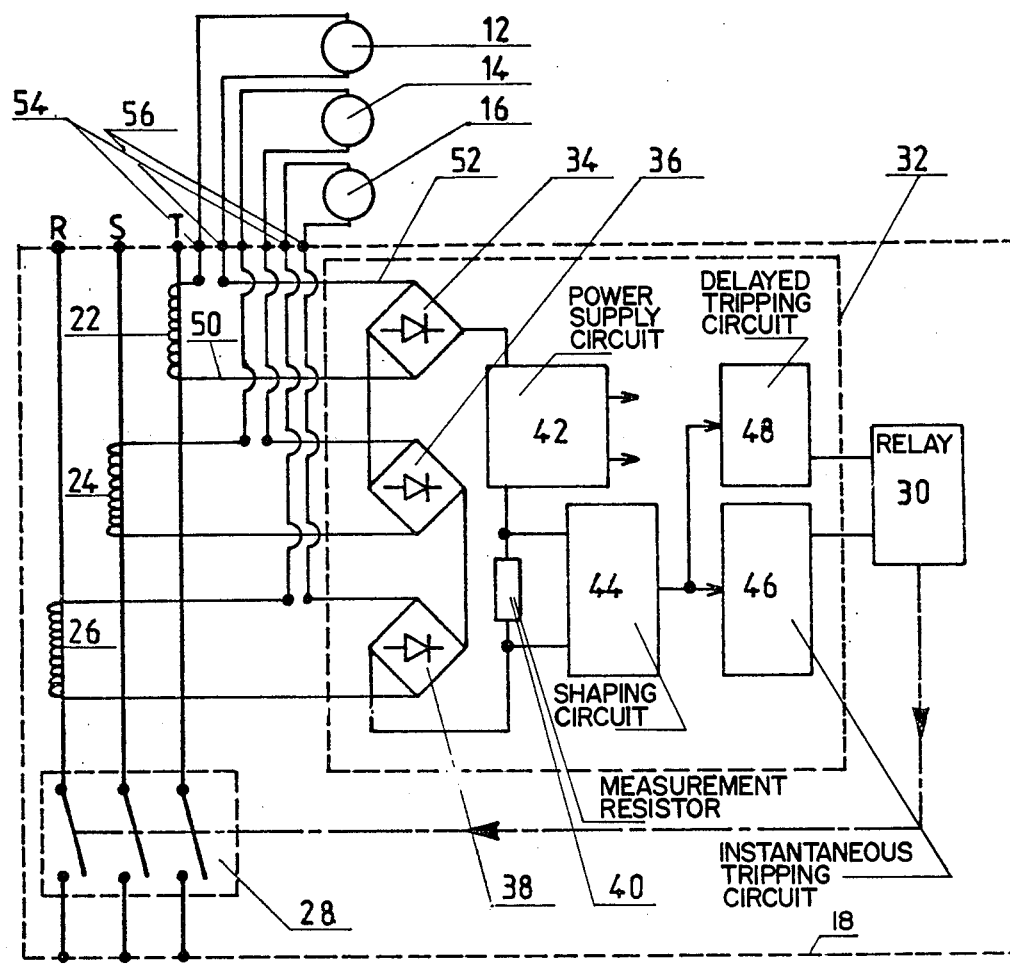
FIG. 2 is a circuit diagram of the current measuring device according to the invention.

FIG. 2 represents a circuit diagram of the electronic release of the circuit breaker 18, this diagram being the subject of the U.S. Pat. No. 4,571,659 which is herein incorporated by reference and which should be referred to for further details. It is obvious that invention is not limited to this particular diagram and that it is applicable to any other electronic release. In FIG. 2, the current transformers 22, 24, 26, control the intensity of the current flowing in lines R, S, T, in which the breaking contacts 28 are inserted. Opening of the contacts 28 when a fault occurs is controlled by a relay 30 receiving the tripping order from a processing unit 32 which receives the signals from the current transformers 22, 24, 26. The processing unit 32 comprises three rectifier bridges 34, 36, 38, the inputs of which are respectively connected to the current transformers 22, 24, 26, and the outputs of which are connected in series and the total rectified current applied to a circuit comprising a measurement resistor 40 and a power supply circuit 42.

The measuring signal at the terminals of the resistor 40 is delivered to a level detector associated with a shaping circuit 44 cooperating with an instantaneous tripping circuit 46 and a delayed tripping circuit 48. The relay 30 is driven by the output signals of the tripping circuits 46, 48 to cause an opening of the contacts 28 when the line current exceeds a predetermined threshold. The circuit or unit 42 supplies power to the electronics of the processing unit 32 and relay 30.

The power conductor T consitutes the primary winding of the current transformer 22 the secondary winding of which is connected by means of two connecting wires 50, 52 to the rectifier bridge 34. According to the present invention, the connecting wire 52 is interrupted and connected to the two terminals 54, 56 of an outlet located on the wall of the molded case 18. The indicator 12 of the switchboard 10 is connected to the terminals 54, 56 to constitute with the processing unit circuit 32 a series circuit connected to the current transformer 22 output. The alternating current flowing in this series circuit constituted by the indicator 12 and the processing unit 32 is a function of or porportional to the current flowing in phase T, which is equal to the current supplied to the switchboard 10 by the incoming cables 20. In FIG. 2, the indicators 14, 16 are connected in an identical way to that described for indicator 12, respectively to the current transformers 24, 26 to measure the currents flowing in the other phases S and R. It is possible to make do with a single indicator 12 to measure the current of a single phase, in which case the terminals 54, 56 which are not used should be short-circuited to maintain the power supply to the processing unit 32. The current measuring device according to the invention is not limited to a three-pole circuit and circuit breaker, but can for example be applied to a four-pole circuit breaker, the current flowing in the fourth pole being measured in an absolutely identical manner to that described above. The device 18 can be a contactor or a switch fitted at any point of the switchboard 10, notably at the head of a feeder, in which case the indicators will provide measurement of the current in this feeder circuit. The outlets 54, 56 should preferably be fitted to the molded case 18 at the outset to enable the indicators 12, 14, 16, to be subsequently connected to an already existing switchboard. The presence of these outlets hardly makes manufacture of the circuit breaker 18 any more complicated and avoids special current transformers having to be fitted for the indicators 12, 14, 16.

Figure 3:
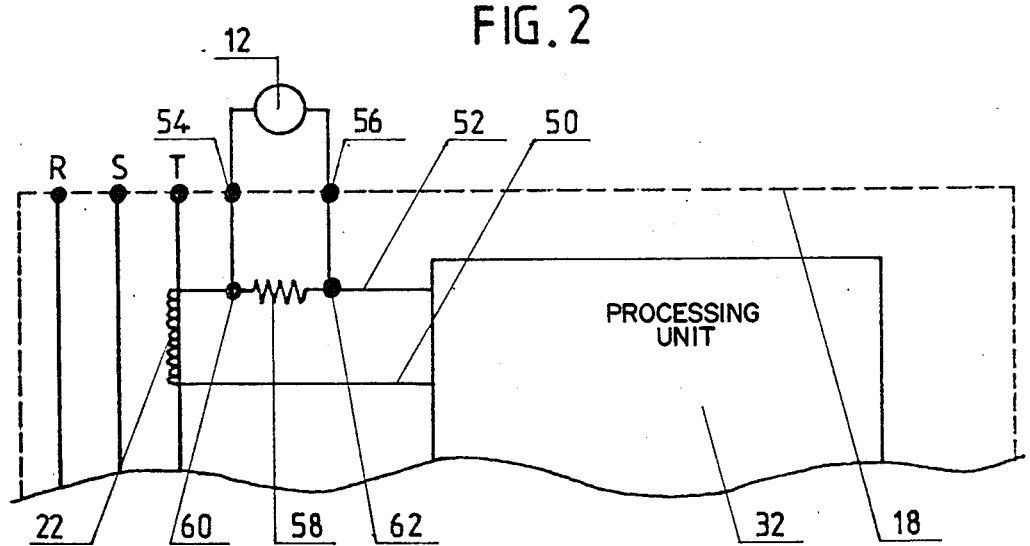
FIG. 3 is a partial view of the circuit diagram in FIG. 2, illustrating an alternative embodiment.

The circuit illustrated in FIG. 2 presents the serious drawback of non-operation of the protective device, in this instance the circuit breaker 18 not tripping in the event of the indicators 12, 14, 16 being interrupted or disconnected. This drawback is avoided by the circuit in FIG. 3, in which a resistor 58 is inserted in the connecting wire 52 between the current transformer 22 and the processing unit 32, the terminals 54, 56 being connected to the terminals 60, 62 of the resistor 58. It can easily be seen that the indicator 12 is shunted by the resistor 58 and in the event of the indicator 12 circuit being interrupted the processing unit 32 remains supplied by the current flowing in the resistor 58. The resistor 58 is incorporated in the case 18 which avoids any risk of disconnection or poor connection. The indicator 12 can be shunted by any other type of adaptor connected to the terminals 60, 62. By choosing a high rating for the resistor 58, measurement is not disturbed when the indicator 12 is disconnected. The other phases are of course fitted with identical shunt resistors.

Figure 4:
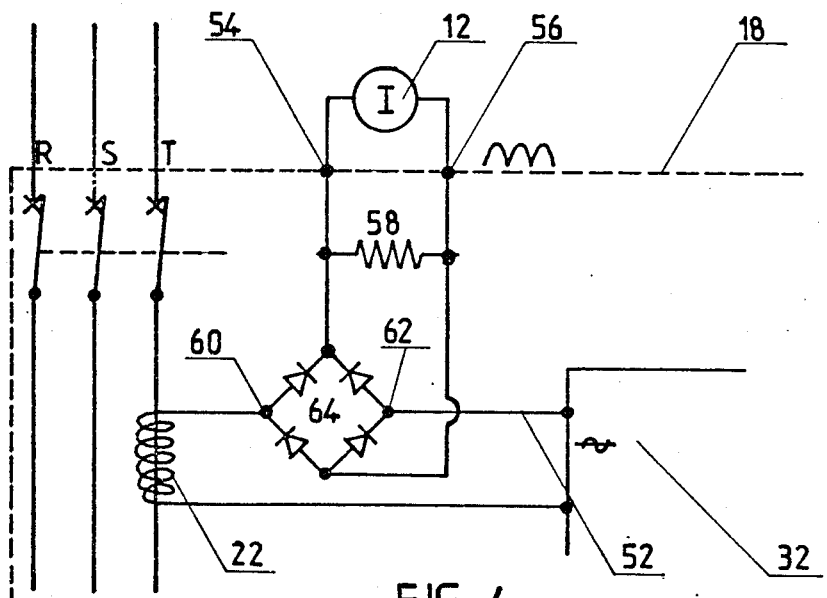
FIG. 4 is a similar view to that of FIG. 3, showing another alternative embodiment.

The current transformers 22, 24, 26, supply alternating current and the indicators 12, 14, 16, can be of the ferromagnetic type well suited to measuring such alternating currents. The burden is relatively high and may require the rating of the current transformers to be increased or else there might be a risk of insufficient power supply to the processing unit 32. In the embodiment according to the invention, represented in FIG. 4, a diode bridge 64 is connected to the terminals 60, 62 of the connecting wire 52. The terminals 54, 56 of the indicator 12 connecting outlet are connected to the opposite ends of the diode bridge 64, the resistor 58 being connected to the terminals 54, 56 to shunt the indicator 12. The current flowing in the indicator 12 is a rectified current and can be used in an indicator 12 of the electro-magnetic type which has a very low burden. The processing unit 32 remains supplied by an alternating current and its operation is not modified by the presence of the rectifier bridge 64.

The rating and graduation of the indicators 12, 14, 16, are well suited to the characteristics of the current transformers 22, 24, 26, to enable the current to be read directly. This requires a range of indicators corresponding to the range of current transformers used. It is possible to use the shunt resistor 58 to modify the rating of the indicators 12, 14, 16, which enables a single indicator to be used for a range of currents by using different adaptors or resistors 58. In this case it is preferable to use a resistor 58 with a relatively low rating in relation to the indicator 12 to cover a wide range of currents to be measured. The appropriate adaptor 58 is incorporated in the circuit breaker 18 on assembly which avoids any risk of error, notably in the choice of suitable indicators.

What is claimed is:

1. An electrical distribution board having a circuit breaker protecting an electrical circuit and an indicator of the current flowing through said circuit, said circuit breaker comprising:

separable contacts inserted in said circuit;

a current transformer for generating an analog signal proportional to said current flowing through the circuit protected by the circuit breaker;

an electronic processing unit to which said analog signal is applied;

contact actuating means responsive to said electronic processing unit for generating a contact opening signal for opening said contacts when a set threshold is exceeded;

a molded case housing the contacts, the transformer, the contact actuating means and the electronic processing unit;

a connecting circuit for connecting the output of the current transformer to the electronic processing unit, said connecting circuit comprising a conductor extending from the output of the current transformer to a first terminal and from a second terminal to the electronic processing unit, said first and second terminals being provided on said molded case and connected to said indicator; and a shunt resistor housed in said case and connected to said first and second terminals to shunt said indicator and ensure the continuity of the connecting circuit when the indicator is disconnected from the terminals.

2. An electrical distribution board according to claim 1, wherein said indicator comprises an electromagnetic ammeter with an internal resistor of a notably lower value than that of the shunt resistor and a rectifier to rectify the analog signal delivered by the current transformer and applied to the ammeter.

3. An electrical distribution board according to claim 2, wherein said shunt resistor is interchangeable for a change of ammeter rating.

* * * * *